United States Patent
Delfino et al.

(10) Patent No.: US 10,872,181 B2
(45) Date of Patent: Dec. 22, 2020

(54) COMPUTER-IMPLEMENTED METHOD OF GENERATING AND DISPLAYING AN EXPLODED VIEW

(71) Applicant: Dassault Systemes, Velizy Villacoublay (FR)

(72) Inventors: Christophe Rene Francis Delfino, Saint Laurent du Var (FR); Guillaume Romain Dayde, Grasse (FR); Jacques De Cherade De Montbron, Antibes (FR); Sebastien Tixier, Saint Cloud (FR); Francois-Xavier Dolbeau, Paris (FR)

(73) Assignee: Dassault Systemes, Velizy Villacoublay (FR)

( * ) Notice: Subject to any disclaimer, the term of this patent is extended or adjusted under 35 U.S.C. 154(b) by 183 days.

(21) Appl. No.: 15/710,511

(22) Filed: Sep. 20, 2017

(65) Prior Publication Data

US 2018/0089362 A1 Mar. 29, 2018

(30) Foreign Application Priority Data

Sep. 29, 2016 (EP) .................................. 16306254

(51) Int. Cl.
*G06F 30/17* (2020.01)
*G06T 17/10* (2006.01)
(Continued)

(52) U.S. Cl.
CPC .............. *G06F 30/17* (2020.01); *G06F 30/15* (2020.01); *G06T 17/10* (2013.01); *G06T 19/00* (2013.01);
(Continued)

(58) Field of Classification Search
CPC .. G06F 17/5086; G06F 17/5095; G06T 17/10
(Continued)

(56) References Cited

U.S. PATENT DOCUMENTS 6,677,940 B1* 1/2004 Tonooka ................. G06T 19/20
345/419
6,725,184 B1 4/2004 Gadh et al.
(Continued)

FOREIGN PATENT DOCUMENTS

EP 1 638 027 A1 3/2006

OTHER PUBLICATIONS

Jianwei Guo et. al., "Illustrating the disassembly of 3D models", Computers &Graphics 37 (2013) pp. 574-581. (Year: 2013).*
(Continued)

*Primary Examiner* — Justin C Mikowski
(74) *Attorney, Agent, or Firm* — Hamilton, Brook, Smith & Reynolds, P.C.

(57) ABSTRACT

A computer-implemented method of generating and displaying an exploded view of a three-dimensional model of an assembly (A) of parts (01, 02, 03), the three-dimensional model having a hierarchical structure comprising a plurality of levels, the method comprising the steps of: a) displaying an unexploded view of the assembly; b) displaying a graphical tool (GT) representing the levels of the structure of the assembly and, for each level, an explosion ratio; c) receiving an input for selecting a level and an explosion ratio, and using the graphical tool for displaying them; d) displaying an exploded view of the assembly, wherein only groups of parts associated to higher levels than the selected one are taken apart. A computer program product, non-volatile computer-readable data-storage medium and computer system for carrying out such a method.

7 Claims, 9 Drawing Sheets

(51) Int. Cl.
*G06T 19/00* (2011.01)
*G06F 30/15* (2020.01)

(52) U.S. Cl.
CPC .... *G06T 2200/24* (2013.01); *G06T 2219/016* (2013.01)

(58) Field of Classification Search
USPC .......................................................... 703/7
See application file for complete search history.

(56) References Cited

U.S. PATENT DOCUMENTS

| | | | | |
|---|---|---|---|---|
| 7,114,131 | B1* | 9/2006 | Ballantine | G06Q 30/02 705/26.61 |
| 7,825,940 | B1* | 11/2010 | Vieilly | G06T 19/20 345/419 |
| 8,452,435 | B1 | 5/2013 | Vicilly et al. | |
| 2003/0043177 | A1* | 3/2003 | Kawai | G06T 19/00 715/700 |
| 2005/0248560 | A1* | 11/2005 | Agrawala | G06T 19/00 345/418 |
| 2012/0221433 | A1* | 8/2012 | Plattsmier | G06Q 30/0633 705/26.8 |
| 2014/0019299 | A1* | 1/2014 | Stewart | H04N 21/23614 705/26.8 |
| 2016/0048293 | A1* | 2/2016 | Chen | G06F 3/04815 715/851 |

OTHER PUBLICATIONS

Wilmot Li et. al., "Interactive Image-Based Exploded View Diagrams", (2004) Proceedings—Graphics Interface p. 203-212. (Year: 2004).*

AlTarawneh, R., et al., "Poster: 3DintEx—A Tool to Explore Interactively the Structural and Behavioral Aspects of System Models in 3D Environments," 2014 IEEE Symposium on 3D User Interfaces (3DUI). IEEE. Mar. 29, 2014 (Mar. 29, 2014), pp. 141-142, XP032586748.

Driskill, E., et al., "Interactive Design, Analysis, and Illustration of Assemblies," Interactive 3D Graphics. Monterey, Apr. 9-12, 1995; [Proceedings of the Symposium on Interactive 3D Graphics], New York, ACM, US, Apr. 9, 1995 (Apr. 9, 1995), pp. 27-33, XP000546186.

European Search Report for EP Application No. 16306254.0 dated Mar. 8, 2017, titled "Computer-Implemented Method of Generating and Displaying an Exploded View," 10 pages.

Li, W., el al., "Automated Generation of Interactive 3D Exploded View Diagrams," ACM Transactions on Graphics, vol. 27. No. 3, Aug. 1, 2008 (Aug. 1, 2008), p. 1, XP055049074.

Tatzgcrn, M., et al., "Compact Explosion Diagrams," Eye Gaze in Intelligent Human Machine Interaction: Eye-Gaze & Multimodality, ACM, 2 Penn Plaza, Suite 701 New York NY 10121-0701 USA, Jun. 7, 2010 (Jun. 7, 2010), pp. 17-26, XP058242673.

\* cited by examiner

- ☑ ● Root
  - ☑ Aircraft Engine
    - ▷ ☑ 03
    - ☑ 02
      - ☑ 02_part1
        - ☑ 02_part1_geometry1
        - ☑ 02_part1_geometry2
      - ▷ ☑ 02_part2
    - ☑ 01
      - ☑ 01_P1
        - ☑ cyl_top
        - ☑ ventil
        - ☑ Shaft
        - ☑ cylinder
        - ☑ Weeble
        - ☑ Weeble
        - ☑ piston
        - ☑ Rod
      - ▷ ☑ 01_P2
      - ▷ ☑ 01_P3
      - ▷ ☑ 01_P4
      - ▷ ☑ 01_P5

COMPUTER-IMPLEMENTED METHOD OF GENERATING AND DISPLAYING AN EXPLODED VIEW

RELATED APPLICATION(S)

This application claims priority under 35 U.S.C. § 119 or 365 to European Application No. 16306254.0, filed Sep. 29, 2016. The entire teachings of the above application(s) are incorporated herein by reference.

FIELD OF INVENTION

The invention relates to a computer-implemented method of generating and displaying an exploded view of a three-dimensional model of an assembly of parts. It applies to the field of computer graphics, and more particularly to the field of three-dimensional (3D) content visualization. It is particularly suited to allow the visualization and exploration of 3D models generated by Computer Aided Design (CAD). It also allows generating exploded views for illustration purposes.

BACKGROUND

Exploded views are useful for showing the relationships and the mounting order of the parts of an assembly, and for making hidden parts visible. In an exploded view, the parts of the assembly are separated from each other and suspended in the surrounding space, as if they were pushed apart by an explosion originating from inside the assembly.

Many graphical software tools allow generating and displaying exploded views. Most of the time, this requires the manual selection of a plurality of sub-assemblies to be exploded, the definition of a displacing direction for the different parts and of an explosion ratio expressing the distance by which individual parts are moved from their initial position. For instance, FIG. 1 shows a partially exploded view of a radial aircraft engine A, wherein the shaft and some components associated to it are exploded along an axial direction. This only allows a very partial understanding of the structure of the engine. If the radially-oriented cylinders were also to be exploded, it would be necessary to select them manually and to define a displacing direction and an explosion ratio for each of them. As a consequence, creating exploded views is often a time-consuming and cumbersome operation. Moreover, it is very difficult to collapse back the exploded assembly, as this requires keeping track manually of the different operations performed to generate the exploded view in order to invert them in reverse order. For the same reason, it is difficult to ensure reproducibility of the explosion operation. Generating an animation wherein the assembly is progressively exploded—extremely useful for understanding the structure of the assembly—is also very complicated using conventional tools.

Some software tools, such as 3DPlay by the applicant, allow exploding all the parts of an assembly A at the same time, as illustrated on FIG. 2. Moreover, the direction along which each part moves is predetermined. The user only has to set the explosion ratio, e.g. using a slider SL (visible on the bottom of FIG. 2). Reproducibility of the explosion is ensured, and it is easy to collapse back the assembly or to obtain a progressive explosion. However, this approach also has significant drawbacks. First of all, it does not allow generating "partial" explosions—wherein some sub-assemblies are exploded while others are not: only "full" explosions can be obtained, resulting in very crowded representations which are difficult to understand and hide the mounting relationship between parts. Moreover, the simultaneous explosion of all the parts of the assembly is very demanding in terms of computing resources.

SUMMARY

The invention aims at overcoming at least some of these drawbacks of the prior art. More particularly it aims at providing a method for creating partially or totally exploded views of an assembly of parts with minimal burden for the user and effective use of the computing resources. It also aims at making easy to collapse back the exploded assembly and/or to obtain a progressive explosion, and at ensuring reproducibility of the generated exploded views.

To achieve these aims, the invention exploits the hierarchical structure of the three-dimensional model of the assembly to be exploded. Indeed, it is well known in the art of Computer Aided Design that assemblies are usually represented using hierarchical data structures, typically trees. For instance, FIG. 3A illustrates, very schematically, the hierarchical structure of a model of an assembly A constituted by six parts: P11, P12, P21, P22, P23 and P30. Parts P11 and P12 belong to a first sub-assembly SA1, and parts P21, P22, P23 to a second sub-assembly SA2. Part P30 does not belong to any sub-assembly (alternatively, it could be considered that P30 constitutes a single-part sub-assembly by itself). FIG. 3B represents the same hierarchical structure in the form of a tree graph: the assembly A itself constitutes the highest-order (zero order) level of the structure; sub-assemblies SA1, SA2 and part P30 the first order, and parts P11, P12, P21, P22 and P23 the second and lowest level.

The invention uses a graphical tool to allow a user to select a particular level of the hierarchical model, and generates an exploded view wherein sub-assemblies of levels higher than the selected one are taken apart while those of the selected level are treated as elementary parts. For instance, FIG. 3C illustrates a level-1 partial explosion, wherein the assembly A is decomposed in its constituents SA1, SA2 and P30, but the latter are not further exploded. Selecting level 2, a total explosion would be obtained, separating the individual elementary parts P11-P30. Advantageously, the graphical tool also allows choosing the explosion ratio.

An object of the present invention is then a computer-implemented method of generating and displaying an exploded view of a three-dimensional model of an assembly of parts, the three-dimensional model having a hierarchical structure comprising a plurality of levels, each part or group of parts of the assembly being associated to one level, a highest-order level of the hierarchical structure corresponding to the whole assembly, the method comprising the steps of:

a) displaying an unexploded view of the assembly in a three-dimensional scene;

b) displaying a graphical tool representing the levels of the hierarchical structure of the assembly and, for each level, an explosion ratio;

c) receiving a user input for selecting a level of the hierarchical structure of the assembly and an explosion ratio, and using the graphical tool for displaying the selected level and explosion ratio;

d) displaying an exploded view of the assembly, wherein groups of parts associated to higher levels than the selected one are taken apart, while those associated to the selected level or lower ones are not.

According to particular embodiments of the inventive method:

In step d), parts or group of parts associated to the selected level may be displaced from their initial position, according to a predetermined directions, by a distance which is a growing function of the selected explosion ratio, while parts associated to higher levels may be displaced by a distance corresponding to a maximal explosion ratio for said level.

The user input received at step c) may be provided by the user by acting on the graphical tool.

The graphical tool may comprise a slider including a plurality of segments, each segment being associated to a level of the hierarchical structure and each position within a segment being associated to an explosion ratio.

The method may further comprise the following step, carried out after step d):

e) receiving a user input for selecting a part or group of parts (01) of the exploded view, associated to the selected or to a higher level, and for moving it within the three-dimensional scene.

The method may further comprise the following steps, carried out after step d):

f) receiving a user input for selecting a group of parts (01) of the exploded view;

g) carrying out steps a) to d) taking the selected group of parts as the assembly.

The method may further comprise a preliminary step of simplifying the hierarchical structure three-dimensional model of an assembly of parts so that it comprises between 2 and 10 levels.

Another object of the invention is a computer program product, stored on a non-volatile computer-readable data-storage medium, comprising computer-executable instructions to cause a computer system to carry out such a method.

Another object of the invention is a non-volatile computer-readable data-storage medium containing computer-executable instructions to cause a computer system to carry out such a method.

Another object of the invention is a computer system comprising a processor coupled to a memory and a graphical user interface, the memory storing computer-executable instructions to cause the computer system to carry out such a method.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

Additional features and advantages of the present invention will become apparent from the subsequent description, taken in conjunction with the accompanying drawings, wherein.

DETAILED DESCRIPTION

A description of example embodiments follows.

Hereafter, a "three-dimensional" (or "3D") model will be the digital representation, in a computer system, of a physical object allowing a three-dimensional (3D) graphical representation. A 3D representation allows the viewing of the part from all angles. For example, a 3D modelled object, when 3D represented, may be handled and turned around any of its axes, or around any axis in the screen on which the representation is displayed. A three-dimensional scene is constituted by a plurality of 3D modelled objects disposed in a three-dimensional space. An "assembly" will be a modelled object constituted by a plurality of geometrically connected components, or "parts". Assembly models may have a multi-level hierarchical structure, in which case some of the parts may be sub-assemblies, i.e. groups of lower-level (simpler) parts.

Figure 1:
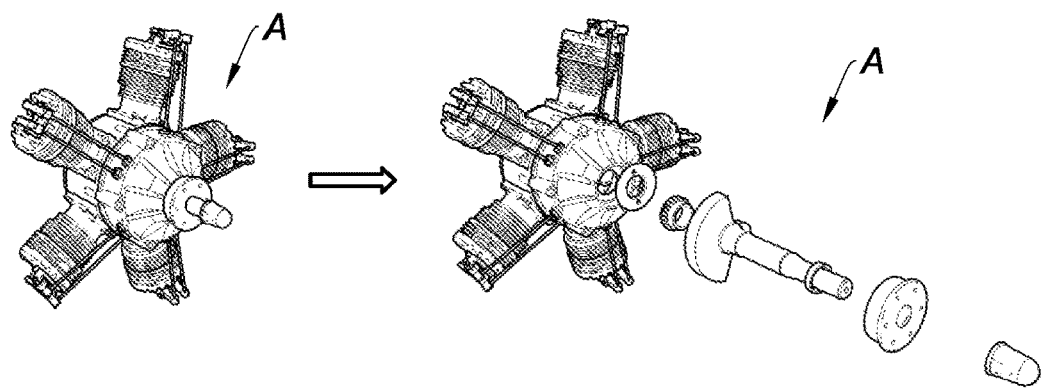
FIGS. 1 and 2, described above, relate to the prior art.
Figure 2:
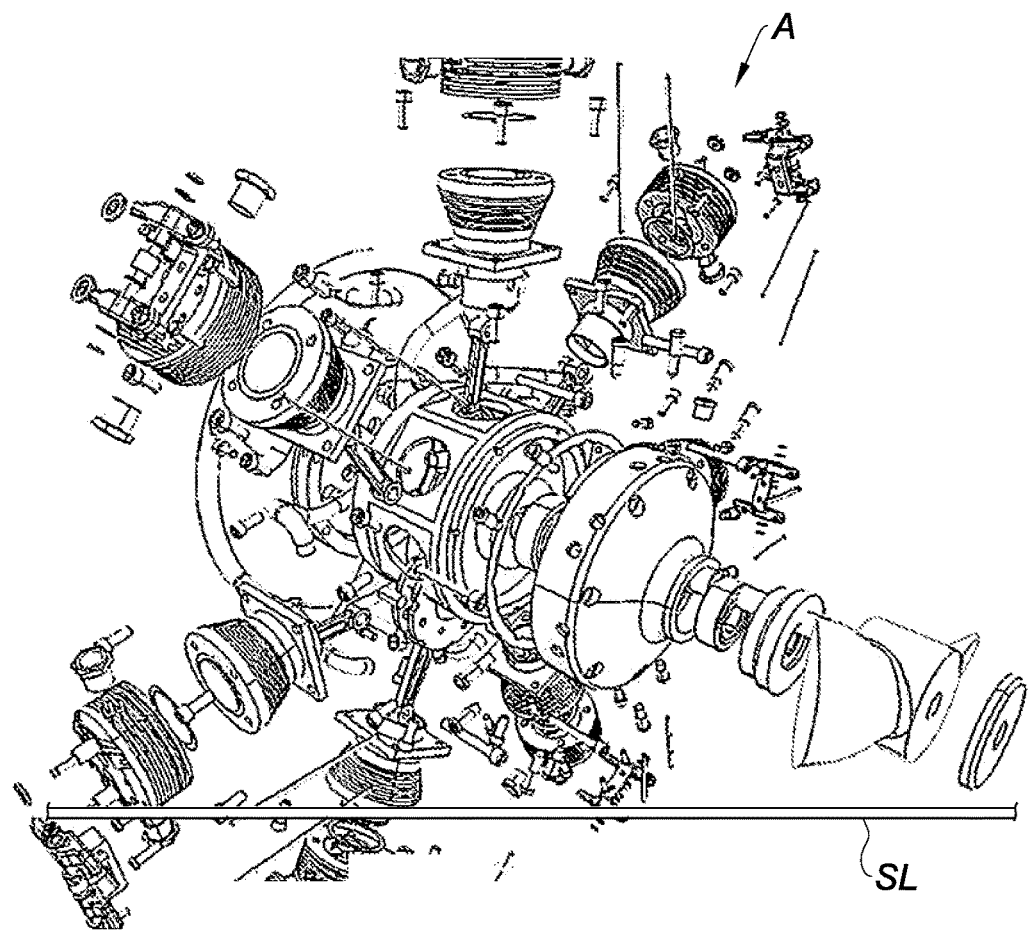
Figure 3A:
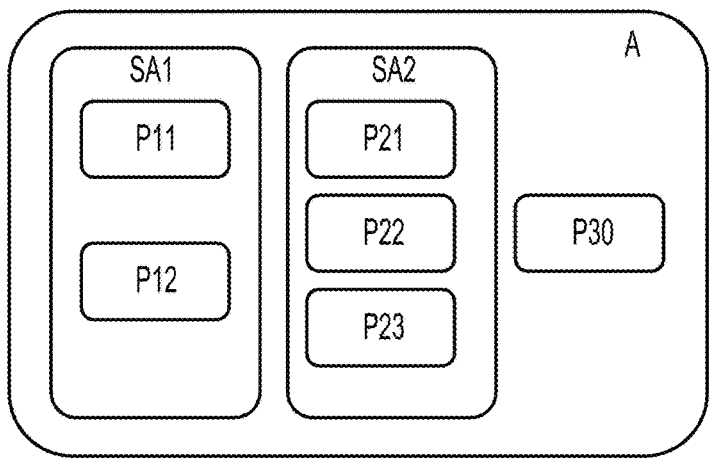
FIGS. 3A, 3B and 3C, also described above, illustrate the hierarchical structure of the model of an assembly of parts (3A, 3B) and its utilization by the invention (3C)
Figure 3B:
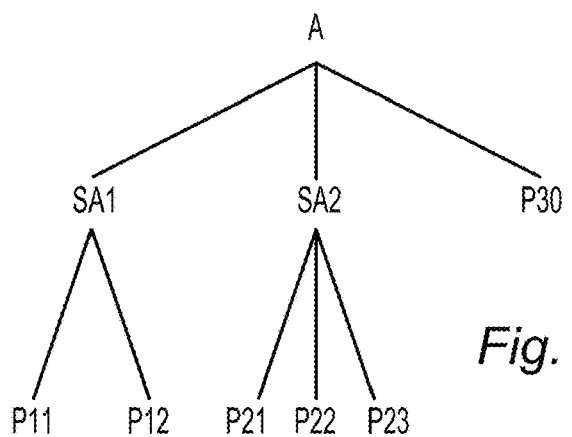
Figure 3C:
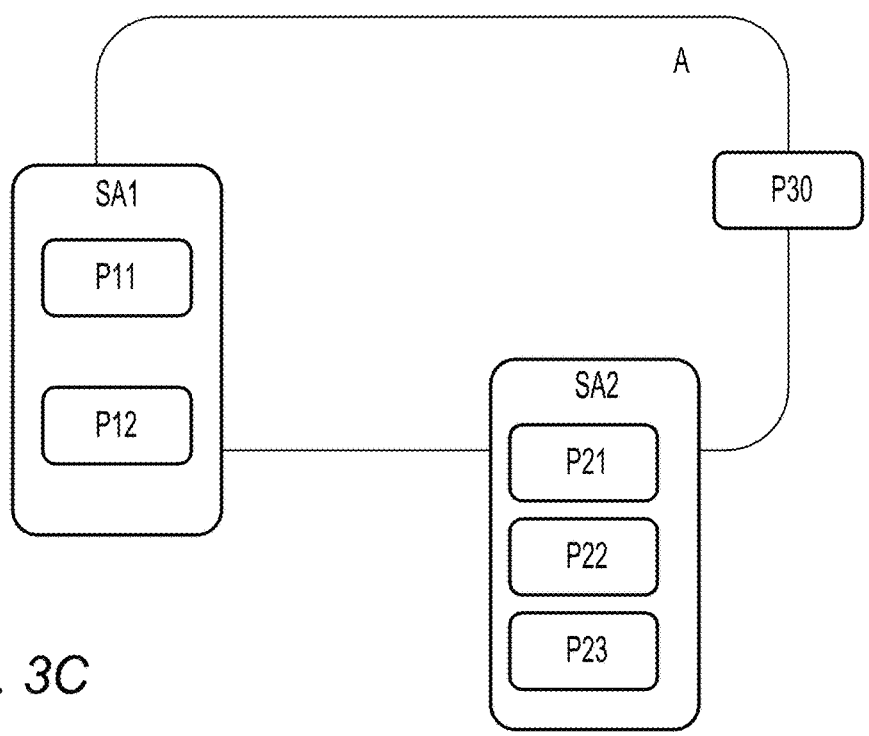
Figures 4A, 4B:
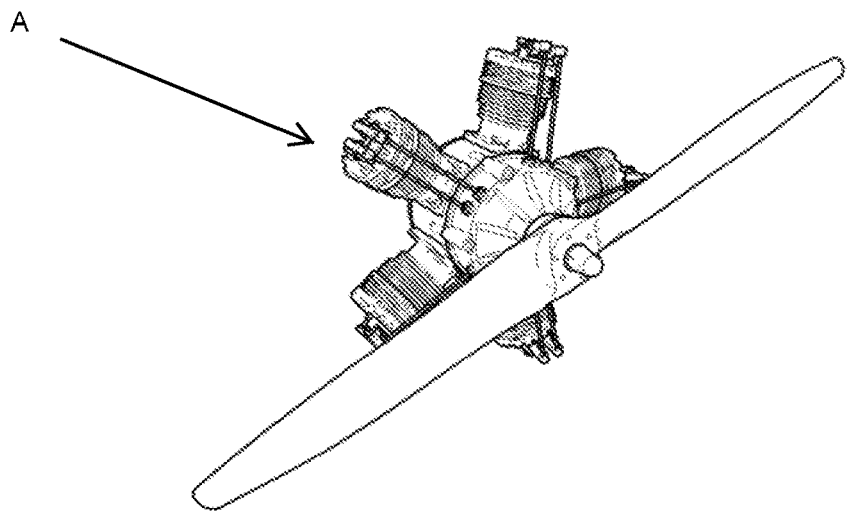
FIGS. 4A and 4B illustrate the hierarchical structure of the three-dimensional model of a radial aircraft engine.

FIG. 4A shows an assembly of parts A, constituting a radial aircraft engine (cf. FIG. 1). FIG. 4B is a tree representation of its hierarchical structure. The top (zero order) level of the structure comprises the assembly itself. The first level is constituted by three sub-assemblies "03", "02" and "01". Sub-assembly "03" has a hierarchical internal structure which is hidden; sub-assembly "02" comprises two second-level parts "02_part1", consisting of elementary parts "02_part1_geometry1" and "02_part1_geometry1", which are at the third and lowest hierarchical level, and "02_part2", with no further sub-structure; sub-assembly "01" consists of five two-level parts "01_P1", "01_P2", "01_P3", "01_P4" and "01_P5"; of them, "01_P1" consists of eight third-level parts "cyl_top", "ventil", "Shaft", "cylinder", "Weeble" (twice), "piston" and "Rod".

Sometimes, the hierarchical structure is very deep, with more than ten hierarchical levels. In such a case, the implementation of the invention would be too complex, and lead to results which could be confusing for the user. It is then recommended to simplify the structure. For instance, when a node has a single child, it can be merged with it without any loss of information. In some other cases, it will be necessary to "artificially" merge nodes to keep the complexity of the model at a manageable level, even if this involves some information losses. Advantageously, the number of levels of the hierarchical structure does not exceed 10, and preferably 6.

Figure 5:
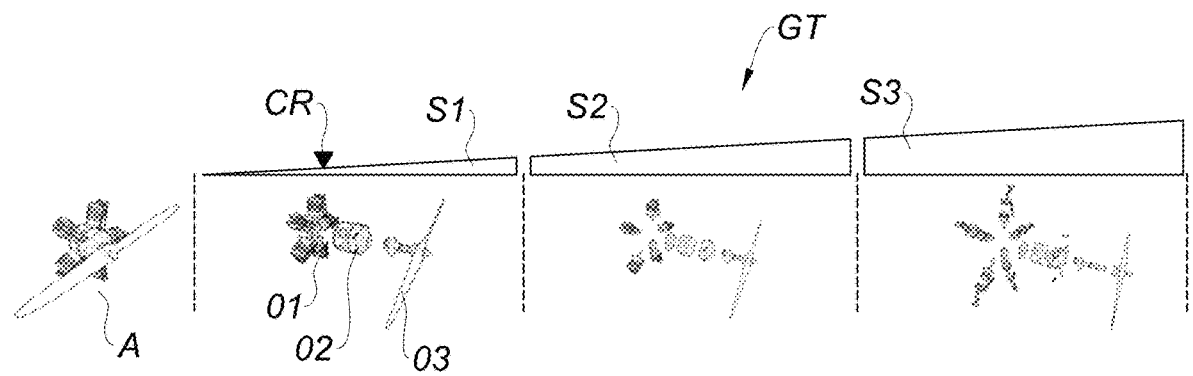
FIG. 5 represents a graphical tool in the form of a multi-segment slider used in an embodiment of the invention, and illustrates the relationship between the segments of the slider and the hierarchical structure of the assembly of FIGS. 4A, 4B.
Figure 6A:
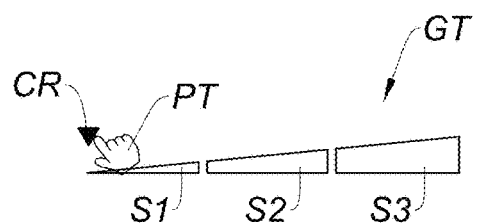
FIGS. 6A, 6B and 7 illustrate the functions of the graphical tool of FIG. 5.
Figure 6B:
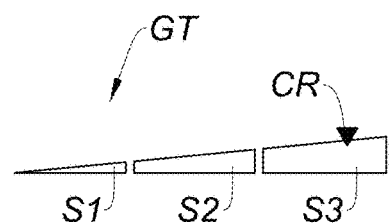
Figure 7:
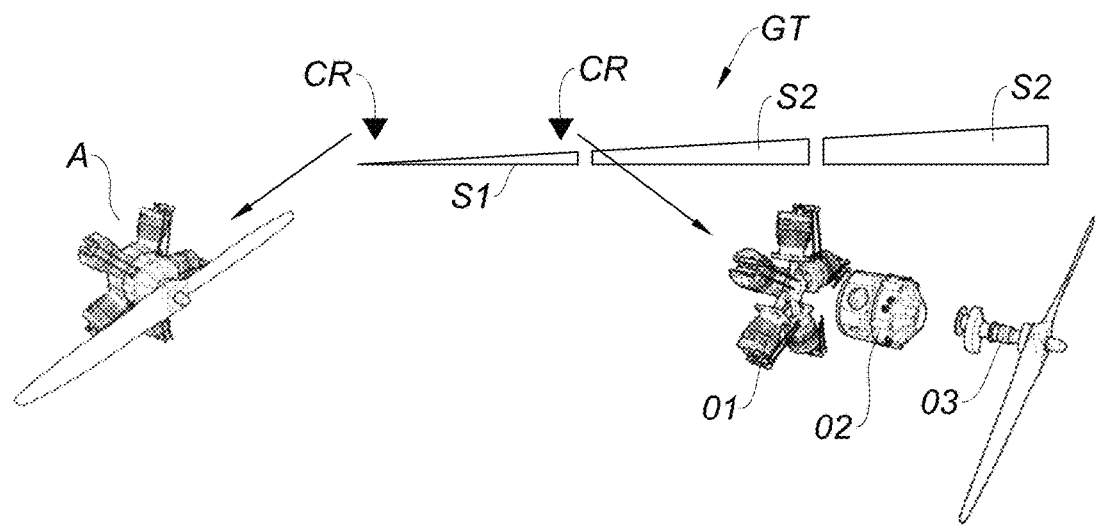

FIG. 5 illustrates the principle of the hierarchical decomposition. From left to right are represented:

the un-exploded assembly A;

its first-level explosion, wherein the first-level sub-assemblies are separated from each other;

its second-level explosion, wherein the first-level subassemblies are taken apart, and their second-order elements are separated from each other; and its third-level explosion, wherein all sub-assemblies are disassembled.

A graphic tool GT is superimposed to the three-dimensional scene in order to display to which order the assembly is exploded. In the embodiment of FIGS. 5 to 12, the graphic tool is in the form of a slider constituted by a plurality of segments S1-S3, one for each level of the hierarchical structure except the zero-order one, corresponding to the unexploded assembly, and a cursor CR. When a first-order explosion of the assembly is displayed, the cursor CR is positioned on or near segment S1; when a second-order explosion of the assembly is displayed, the cursor CR is positioned on or near segment S2; and when a third-order explosion of the assembly is displayed, the cursor CR is positioned on or near segment S3. Moreover, in the embodiment of FIGS. 5 to 12, the position of the cursor on each segment is related to the explosion ratio. For instance, the further to the right the cursor is positioned on a segment, the higher will be the explosion ratio (and therefore the relative distance of the parts) at the corresponding hierarchical level of the structure of the assembly. This is illustrated on FIG. 7. A tapered shape of the segments of the graphic tool (slider) symbolically represents this explosion ratio. Of course, the graphic tool may have any other suitable shape, for instance that of a rotating control knob.

Advantageously, the graphical tool is not only used to provide feedback to a user, indicating the level at which the explosion is carried out and the explosion ratio, but also to select these level and ratio. For instance, as illustrated on FIGS. 6A, 6B, a pointer PT—e.g. controlled by a mouse, joystick, touchpad or trackball—may be used to move the cursor CR—e.g. from the left of segment S1, corresponding to a first-level partial explosion with a very small—or even zero—explosion ratio to the right of segment S3, corresponding to a full (third-level) explosion with maximal explosion ratio. The three-dimensional image of the assembly evolves then smoothly to conform to the selected explosion level and ratio.

Figure 8A:
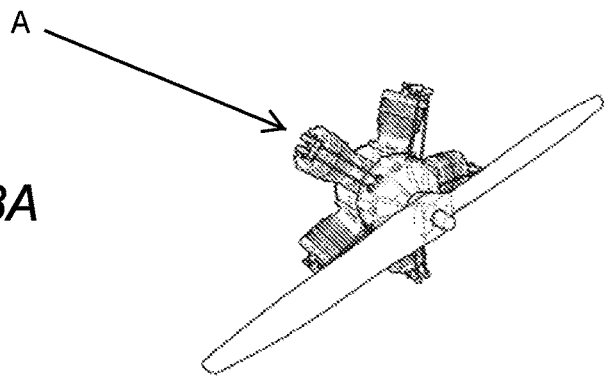
FIGS. 8A-8D show a progressive explosion of the assembly of FIGS. 4A, 4B, obtained according to an embodiment of the invention using the graphical tool of FIGS. 5-7.
Figure 8B:
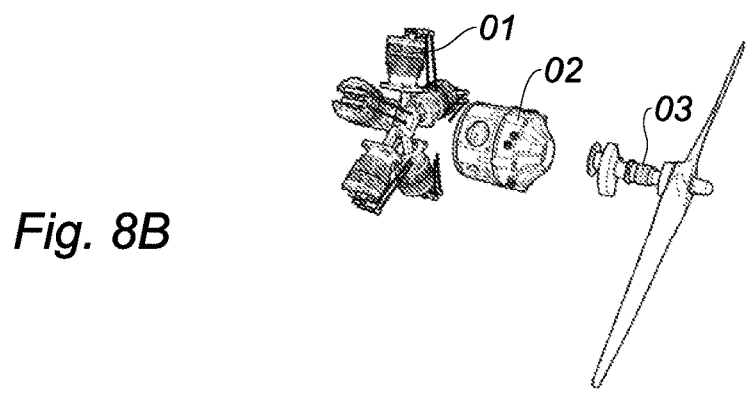
Figure 8C:
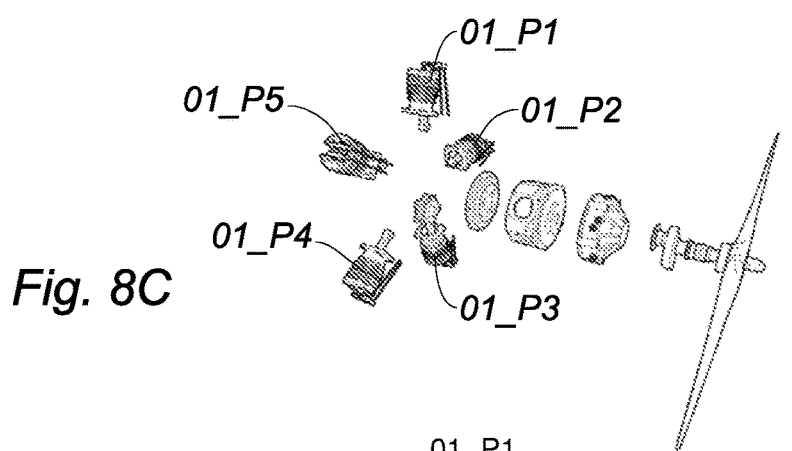
Figure 8D:
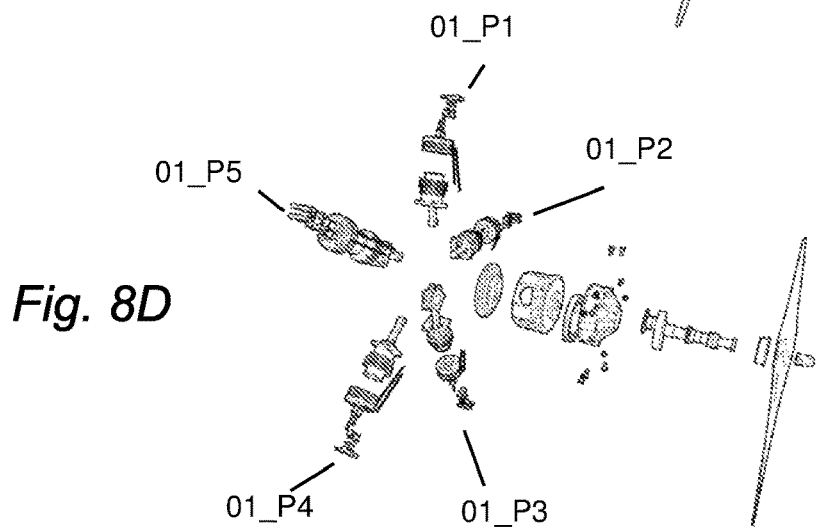
Figure 9:
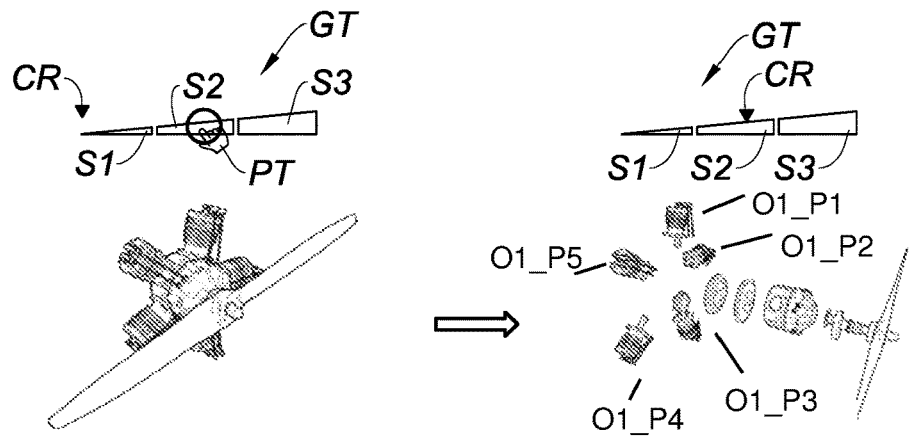
FIGS. 9 to 12 illustrate additional advantageous features of the invention.

FIGS. 8A and 8D are snapshots of a progressive explosion obtained by gradually moving the cursor from the left to the right. FIG. 8A corresponds to the initial (unexploded) condition. As the cursor starts moving toward the right above or on segment S1 of the slider, first-level subassemblies begin to move away from each other (FIG. 8B). Then, the cursor arrives above or on segment S2: first-level subassemblies stop moving away from each other (their barycentres keep fixed relative positions), but start exploding, and their second-level sub-assemblies separate (FIG. 8C). Similarly, when the cursor arrives above or on segment S3, second-level subassemblies stop moving away from each other and explode, and third-order elements begin to pull out (FIG. 8D).

Reverting the progressive explosion is extremely easy: the user simply has to move the cursor toward the left.

In order to move the cursor CR, it is possible to drag-and-drop it using pointer PT. More simply, it is possible to click on a segment (e.g. segment S2, as in FIG. 9) and the cursor will move toward its middle—preferably in a smooth, gradual way, from its initial position (e.g. the left of segment S1 in the same FIG. 9).

Figure 10A:
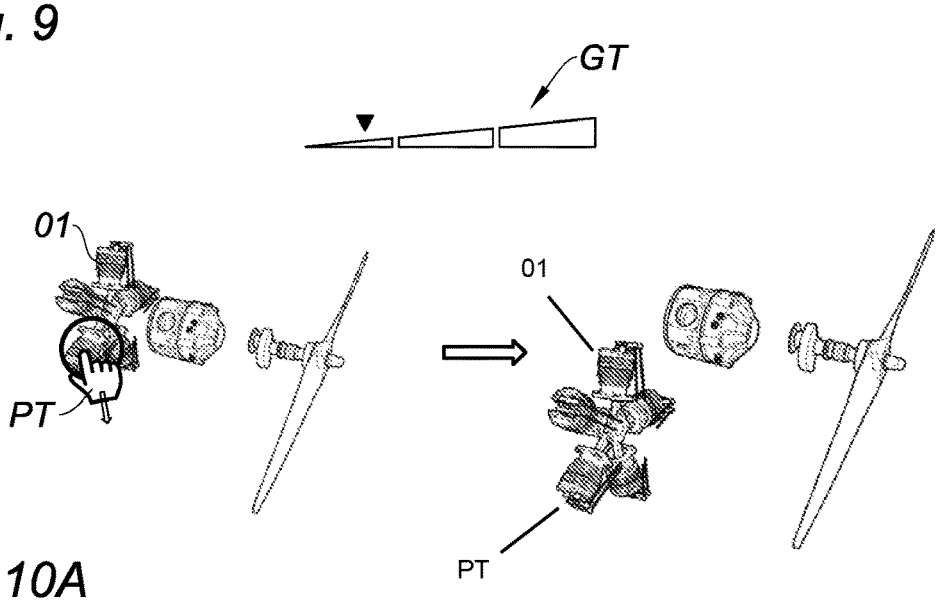
Figure 10B:
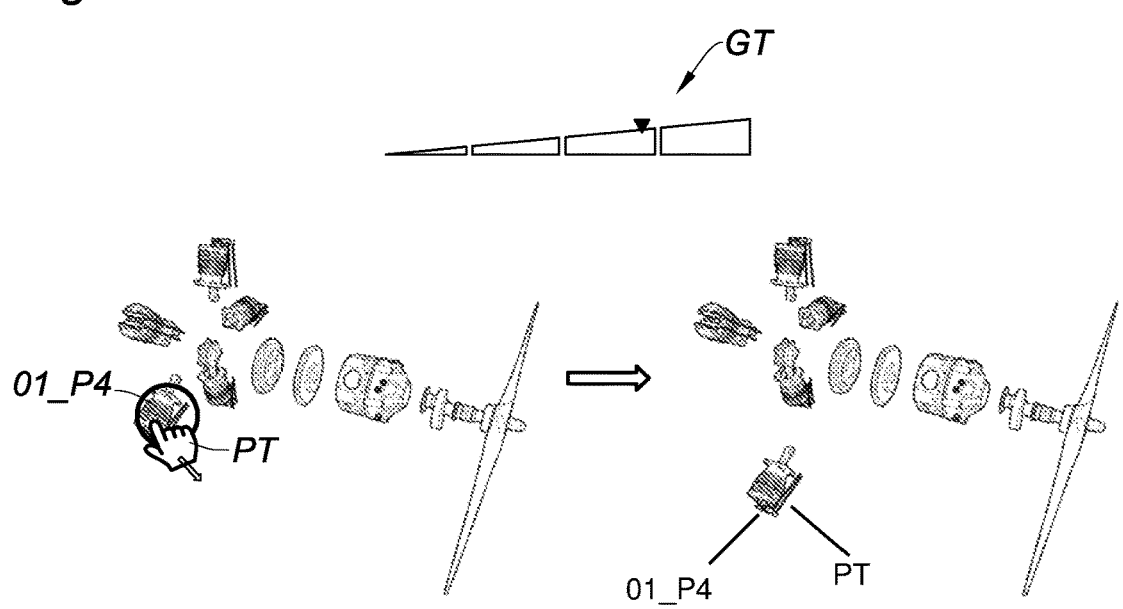

As illustrated on FIGS. 10A and 10B, which relate to explosions at different levels, the user can use pointer PT for moving an element within the 3D scene by clicking and dragging it. In the case of FIG. 10A, the level selected using the graphic tool is the first one therefore, if the pointer is positioned on a cylinder, the whole star-shaped cylinder block 01 constituting the corresponding first-level element of the hierarchical structure is selected and displaced. Instead, in the case of FIG. 10B, the "current" level is the second, and therefore it is the individual cylinder 01_P4 that is selected and displaced. Advantageously, when an element has been moved, it snaps back to its original position as soon as the user interacts with the graphical tool again.

Figure 11A:
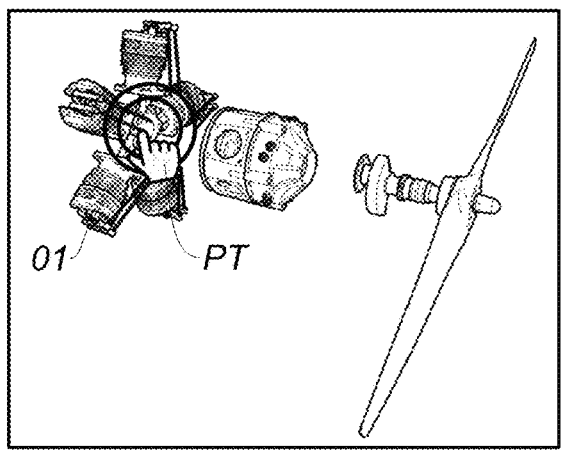
Figure 11B:
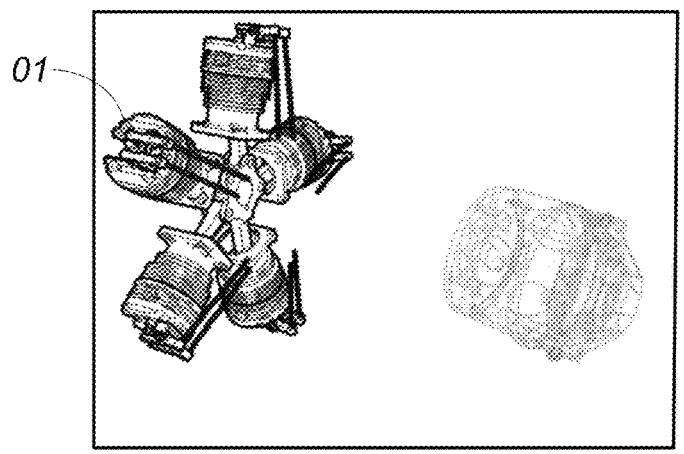
Figure 11C:
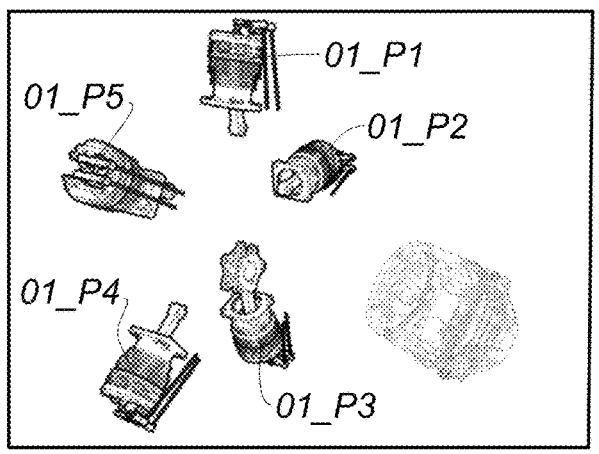

As illustrated on FIGS. 11A-11C, the user may also select a particular sub-assembly, such as the star-shaped cylinder block 01, e.g. by double-clicking on it using the pointer PT (FIG. 11A). The selected element is then put at the centre of the displayed view, while other elements are represented as shadows or "watermarks" to be less prominent (FIG. 11B). The graphical tool GT is replaced by a new one, GT', which only represents the hierarchical levels of the selected element. The user can then explore the structure of the selected element by exploding it using the new graphical tool GT' (FIG. 11C). It is interesting to note that the new graphical tool GT' is not necessarily simpler than the original one. Indeed, as explained above with reference to FIG. 5, in order to keep the complexity of the graphical tool GT manageable, it may be necessary to simplify the hierarchical structure of the assembly by merging some of its nodes—and the corresponding hierarchical levels. When only a sub-assembly is selected, these nodes may be un-merged, and the corresponding hierarchical level be restored. Therefore the exploration of an isolated sub-assembly may be more detailed than that of the whole assembly.

Figure 12:
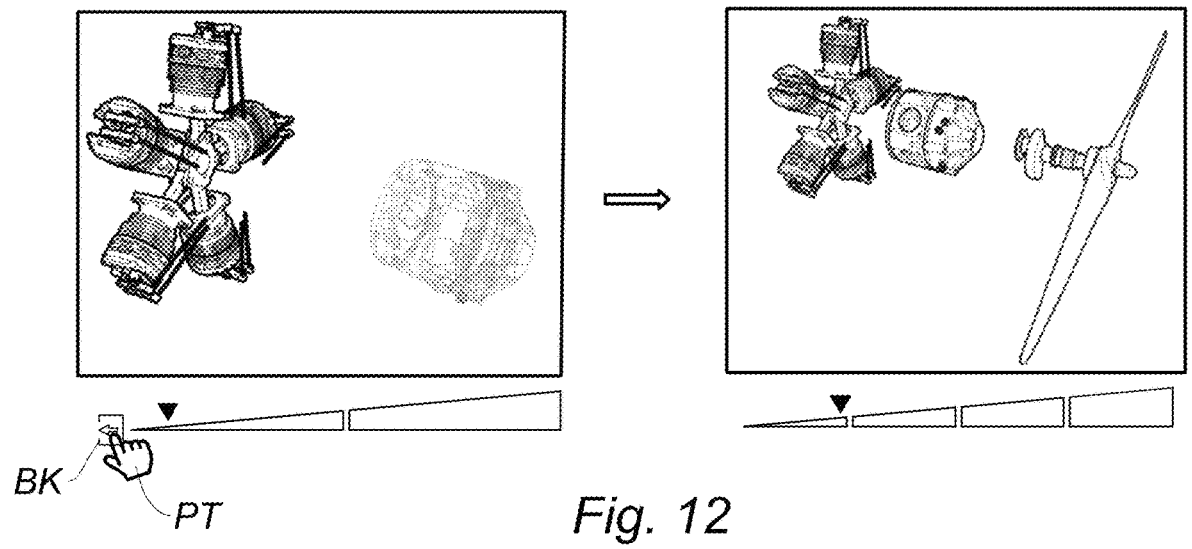

A "back" button BK situated near the slider allows moving back to the previous representation (FIG. 12).

Figure 13:
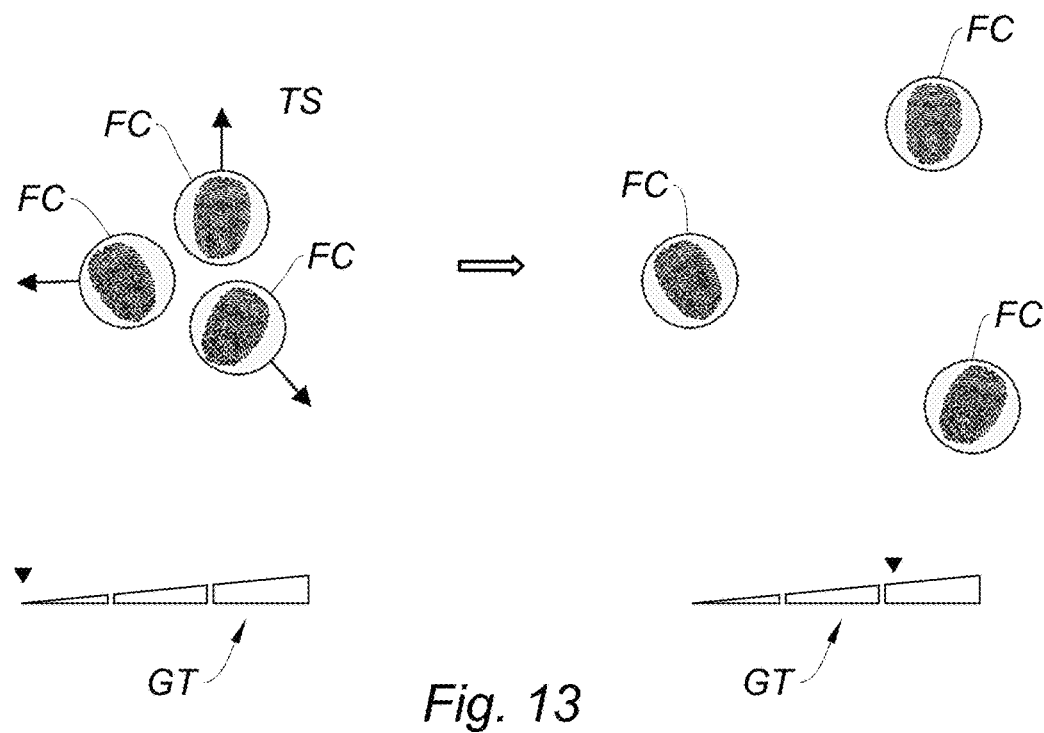
FIG. 13 illustrates an alternative embodiment of the invention, making use of a touch screen.

FIG. 13 refers to an alternative embodiment of the invention, wherein the graphical tool GT is only used to display the selected explosion level and ratio, the selection being performed in a different way. In this embodiment, the 3D scene is displayed on a touch-screen, and a three-finger pinch gesture is used to command the explosion. For instance, when the finger contact points FC are moved away from each other, the explosion ratio is increased up to its maximal value; if the outward movement of the contact points continues, the next level of explosion is activated and so on.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 14:
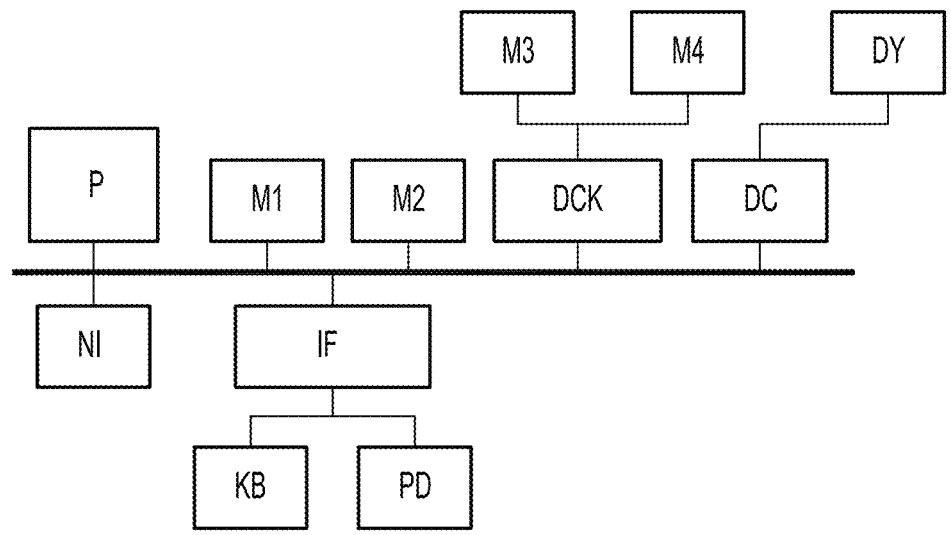
FIGS. 14 and 15 are block diagrams of respective computer systems suitable for carrying out a method according to different embodiments of the invention.

A computer suitable for carrying out a method according to an exemplary embodiment of the present invention is described with reference to FIG. 14. In FIG. 14, the computer includes a Central Processing Unit (CPU) P which performs the method step described above while running an executable program, i.e. a set of computer-readable instructions, stored in a memory device such as RAM M1 or ROM M2 or hard disk drive (HDD) M3, DVD/CD drive M4, or stored remotely. Moreover, one or more computer files defining the three-dimensional model of the assembly may also be stored on one or more of memory devices M1 to M4, or remotely.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the computer communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU P and an operating system such as Microsoft VISTA, Microsoft Windows 8, UNIX, Solaris, LINUX, Apple MAC-OS and other systems known to those skilled in the art.

CPU P can be a Xenon processor from Intel of America or an Opteron processor from AMD of America, or can be other processor types, such as a Freescale ColdFire, IMX, or ARM processor from Freescale Corporation of America. Alternatively, the CPU can be a processor such as a Core2 Duo from Intel Corporation of America, or can be implemented on an FPGA, ASIC, PLD or using discrete logic circuits, as one of ordinary skill in the art would recognize. Further, the CPU can be implemented as multiple processors cooperatively working to perform the computer-readable instructions of the inventive processes described above.

The computer in FIG. 14 also includes a network interface NI, such as an Intel Ethernet PRO network interface card from Intel Corporation of America, for interfacing with a network, such as a local area network (LAN), wide area network (WAN), the Internet and the like. The computer further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands—e.g. to move the pointer—and by the computer for displaying the three-dimensional scene and the graphical tool.

Disk controller DKC connects HDD M3 and DVD/CD M4 with communication bus CBS, which can be an ISA, EISA, VESA, PCI, or similar, for interconnecting all of the components of the computer.

A description of the general features and functionality of the display, keyboard, pointing device, as well as the display controller, disk controller, network interface and I/O interface is omitted herein for brevity as these features are known.

Figure 15:
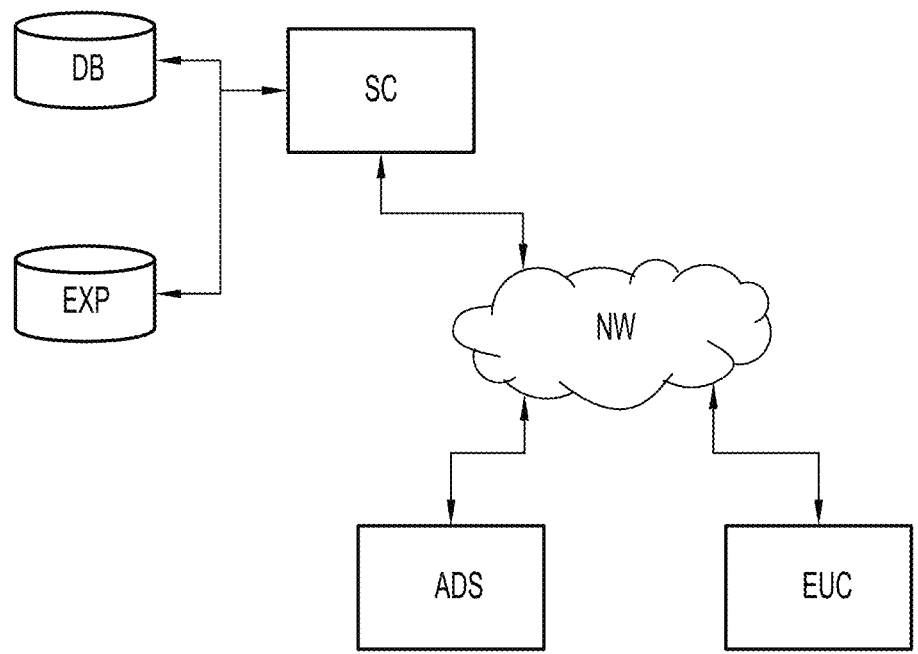

FIG. 15 is a block diagram of a computer system suitable for carrying out a method according to a different exemplary embodiment of the present invention.

In FIG. 15, the executable program EXP and the computer files defining the three-dimensional model of the assembly are stored on memory devices connected to a server SC. The memory devices and the overall architecture of the server may be the same as discussed above with reference to FIG. 14, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 14, except that the memory devices of the administrator system and the end user computer do not store the executable program EXP and/or the computer files defining the three-dimensional model of the assembly. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional model of the assembly. This allows an end user to open and possibly modify such a file, to parameterize a graphical representation of the assembly and to create one or more exploded views as described above. The server performs the processing as described above, and transmits to the end user computer an image file corresponding to the desired representation of the scene including an exploded view of the assembly, again using the network NW.

Although only one administrator system ADS and one end user system EUX are shown, the system can support any number of administrator systems and/or end user systems without limitation. Similarly, multiple servers can also be implemented in the system without departing from the scope of the present invention.

Any method steps described herein should be understood as representing modules, segments, or portions of code which include one or more executable instructions for implementing specific logical functions or steps in the process, and alternate implementations are included within the scope of the exemplary embodiment of the present invention.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A computer-implemented method of generating and displaying an exploded view of a three-dimensional model of an assembly of parts, the three-dimensional model having a hierarchical structure comprising a plurality of levels, each part or group of parts of the assembly being associated to one level, a highest-order level of the hierarchical structure corresponding to the whole assembly, the method comprising the steps of:
   a) displaying an unexploded view of the assembly in a three-dimensional scene;
   b) displaying a graphical tool representing the levels of the hierarchical structure of the assembly and, for each level, a respective explosion ratio expressing a movement distance by which individual parts are moved from their initial position;
   c) receiving a user input for selecting a level of the hierarchical structure of the assembly and the respective explosion ratio by the user acting on the graphical tool, and using the graphical tool for displaying the selected level and the respective explosion ratio; and
d) displaying the exploded view of the assembly, wherein:
all groups of parts associated to higher levels than the selected level are taken apart, while those associated to the selected level or lower ones are not, and wherein all parts or groups of parts associated to the selected level are displaced from their initial position, according to a predetermined directions, by an explosion distance, which is a growing function of the selected explosion ratio, while parts associated with higher levels are displaced by a maximum distance corresponding to a maximal explosion ratio for said level;
wherein the graphical tool comprises a single slider including a plurality of segments, each segment being associated to a level of the hierarchical structure and each position within a segment being associated to one of the respective explosion ratios.

2. The computer-implemented method of claim 1, further comprising the following step, carried out after step d):
e) receiving a user input for selecting a part or group of parts of the exploded view, associated to the selected or to a higher level, and for moving it within the three-dimensional scene.

3. The computer-implemented method of claim 1, further comprising the following steps, carried out after step d):
f) receiving a user input for selecting a group of parts of the exploded view;
g) carrying out steps a) to d) taking the selected group of parts as the assembly.

4. The computer-implemented method of claim 1, further comprising a preliminary step of simplifying the hierarchical structure of the three-dimensional model so that it comprises between 2 and 10 levels.

5. A computer program product, comprising:
a non-volatile computer-readable data-storage medium, carrying computer-executable instructions to cause a computer system to generate and display an exploded view of a three-dimensional model of an assembly of parts, the three-dimensional model having a hierarchical structure comprising a plurality of levels, each part or group of parts of the assembly being associated to one level, a highest-order level of the hierarchical structure corresponding to the whole assembly, the generating and displaying being by:
a) displaying an unexploded view of the assembly in a three-dimensional scene;
b) displaying a graphical tool representing the levels of the hierarchical structure of the assembly and, for each level, an explosion ratio expressing the distance by which individual parts are moved from their initial position;
c) receiving a user input for selecting a level of the hierarchical structure of the assembly and an explosion ratio by the user acting on the graphical tool, and using the graphical tool for displaying the selected level and explosion ratio;
d) displaying an exploded view of the assembly, wherein:
all groups of parts associated to higher levels than the selected one are taken apart, while those associated to the selected level or lower ones are not, and wherein all parts or group of parts associated to the selected level are displaced from their initial position, according to a predetermined directions, by a distance which is a growing function of the selected explosion ratio, while parts associated to higher levels are displaced by a distance corresponding to a maximal explosion ratio for said level;
wherein the graphical tool comprises a single slider including a plurality of segments, each segment being associated to a level of the hierarchical structure and each position within a segment being associated to an explosion ratio.

6. A non-volatile computer-readable data-storage medium comprising:
a memory area containing computer-executable instructions that cause a computer system to generate and display an exploded view of a three-dimensional model of an assembly of parts, the three-dimensional model having a hierarchical structure comprising a plurality of levels, each part or group of parts of the assembly being associated to one level, a highest order level of the hierarchical structure corresponding to the whole assembly, the generating and displaying being by:
a) displaying an unexploded view of the assembly in a three-dimensional scene;
b) displaying a graphical tool representing the levels of the hierarchical structure of the assembly and, for each level, an explosion ratio expressing the distance by which individual parts are moved from their initial position;
c) receiving a user input for selecting a level of the hierarchical structure of the assembly and an explosion ratio by the user acting on the graphical tool, and using the graphical tool for displaying the selected level and explosion ratio;
d) displaying an exploded view of the assembly, wherein:
all groups of parts associated to higher levels than the selected one are taken apart, while those associated to the selected level or lower ones are not, and wherein all parts or group of parts associated to the selected level are displaced from their initial position, according to a predetermined directions, by a distance which is a growing function of the selected explosion ratio, while parts associated to higher levels are displaced by a distance corresponding to a maximal explosion ratio for said level;
wherein the graphical tool comprises a single slider including a plurality of segments, each segment being associated to a level of the hierarchical structure and each position within a segment being associated to an explosion ratio.

7. A computer system comprising:
a processor coupled to a memory and a graphical user interface,
the memory storing computer-executable instructions that cause the computer system to generate and display an exploded view of a three-dimensional model of an assembly of parts, the three-dimensional model having a hierarchical structure comprising a plurality of levels, each part or group of parts of the assembly being associated to one level, a highest order level of the hierarchical structure corresponding to the whole assembly, the generating and displaying being by:
a) displaying an unexploded view of the assembly in a three-dimensional scene;
b) displaying a graphical tool representing the levels of the hierarchical structure of the assembly and, for each level, an explosion ratio expressing the distance by which individual parts are moved from their initial position;
c) receiving a user input for selecting a level of the hierarchical structure of the assembly and an explosion ratio by the user acting on the graphical tool, and using the graphical tool for displaying the selected level and explosion ratio;

d) displaying an exploded view of the assembly, wherein:
all groups of parts associated to higher levels than the selected one are taken apart, while those associated to the selected level or lower ones are not, and wherein all parts or group of parts associated to the selected level are displaced from their initial position, according to a predetermined directions, by a distance which is a growing function of the selected explosion ratio, while parts associated to higher levels are displaced by a distance corresponding to a maximal explosion ratio for said level;

wherein the graphical tool comprises a single slider including a plurality of segments, each segment being associated to a level of the hierarchical structure and each position within a segment being associated to an explosion ratio.

\* \* \* \* \*